United States Patent
Yamada (10) Patent No.: US 12,211,523 B2
(45) Date of Patent: Jan. 28, 2025

(54) TERMINAL CONNECTION PORTION FOR ELECTRONIC DEVICE

(71) Applicant: NHK SPRING CO., LTD., Yokohama (JP)

(72) Inventor: Yukie Yamada, Yokohama (JP)

(73) Assignee: NHK SPRING CO., LTD., Kanagawa (JP)

( * ) Notice: Subject to any disclaimer, the term of this patent is extended or adjusted under 35 U.S.C. 154(b) by 204 days.

(21) Appl. No.: 18/093,759

(22) Filed: Jan. 5, 2023

(65) Prior Publication Data

US 2023/0223049 A1     Jul. 13, 2023

(30) Foreign Application Priority Data

Jan. 12, 2022   (JP) ................. 2022-003100

(51) Int. Cl.
| | |
|---|---|
| *G11B 33/12* | (2006.01) |
| *H01R 4/04* | (2006.01) |
| *H01R 12/62* | (2011.01) |
| *H01R 12/65* | (2011.01) |
| *H05K 1/11* | (2006.01) |

(52) U.S. Cl.
CPC ............ *G11B 33/122* (2013.01); *H01R 4/04* (2013.01); *H01R 12/62* (2013.01); *H01R 12/65* (2013.01); *H05K 1/118* (2013.01); *H05K 2201/094* (2013.01); *H05K 2201/09445* (2013.01)

(58) Field of Classification Search
CPC ........ G11B 33/122; H01R 4/04; H01R 12/62; H01R 12/65; H05K 1/118; H05K 2201/094
USPC ......................................................... 361/749
See application file for complete search history.

(56) References Cited

U.S. PATENT DOCUMENTS

| | | | |
|---|---|---|---|
| 8,467,153 B1 | 6/2013 | Pan et al. | |
| 9,496,625 B2 | 11/2016 | Yamada | |
| 2005/0263319 A1* | 12/2005 | Suzuki | H05K 3/4691 174/262 |
| 2015/0136448 A1* | 5/2015 | Sasaki | H05K 1/118 174/251 |

FOREIGN PATENT DOCUMENTS

JP      2015219940 A      12/2015

* cited by examiner

*Primary Examiner* — Andargie M Aychillhum
(74) *Attorney, Agent, or Firm* — Holtz, Holtz & Volek PC (57) ABSTRACT

A first terminal provided on a tail pad portion includes a base portion, a bent portion and an overlapping portion. The base portion includes a first surface fixed to a base insulating layer and a second surface on an opposite side to the first surface. The bent portion is reversed in a thickness direction of the base portion from an end of the base portion towards the second surface. The overlapping portion extends from the bent portion in a direction along the second surface. An anisotropic conductive film (ACF) is disposed between the overlapping portion and the second terminal. The overlapping portion and the second terminal are connected to each other via the ACF.

8 Claims, 8 Drawing Sheets

TERMINAL CONNECTION PORTION FOR ELECTRONIC DEVICE

CROSS-REFERENCE TO RELATED APPLICATIONS

This application is based upon and claims the benefit of priority from prior Japanese Patent Application No. 2022-003100, filed Jan. 12, 2022, the entire contents of which are incorporated herein by reference.

BACKGROUND OF THE INVENTION

1. Field of the Invention

The present invention relates to a terminal connection portion which connects a first terminal and a second terminal of an electronic device to each other, and is suitable, for example, for that of hard disk drives.

2. Description of Related Art

For information processing devices such as personal computers, hard disk drives (hereinafter simply referred to as disk devices) are used. Disk drives include a magnetic disk which rotates around a spindle, a carriage which pivots around a pivot axis and the like. The carriage includes a plurality of arm portions, which is pivoted around the pivot axis by a positioning motor.

To each arm portion, a suspension for disc drive (to be referred to as "suspension" hereinafter) is attached. The suspension includes a load beam, a flexure disposed along she load beam and the like. Near a distal end of the flexure, a slider is mounted. To the slider, elements are provided to access for making accesses such as reading of data recorded on the disk and writing of data.

The flexure includes a metal base (metal substrate), a base insulating layer, a plurality of conductors, a cover layer and the like. The metal base is made from a thin stainless steel plate. The base insulating layer is formed on the metal base. The conductors are formed on the base insulating layer. The cover layer covers the conductors. One end of each conductor is connected to an element of the slider and various types of functional parts. The other end of each conductor is connected to an electronic device such as a preamplifier via a terminal connection portion. The base insulating layer and the cover layer are made of an electrically insulating resin such as polyimide. The base insulating layer, conductors, cover layer and the like constitute a wiring portion.

An example of the flexure is disclosed in JP 2015-219940 A (Patent Literature 1) or U.S. Pat. No. 8,467,153 B1 (Patent Literature 2). The flexure includes a flexure main body set along a load beam and a flexure tail extending in a rear side of the load beam. At an end portion of the flexure tail, a tail pad portion is formed.

In the tail pad portion, a plurality of terminals (to the also referred to as tail terminals) are disposed. These tail terminals are formed to be integrated with the conductors, respectively, at the end portions of the conductors. The tail terminals are electrically connected to the terminals of an electronic device or flexible circuit board via connecting conductive members. The connecting conductive members are anisotropic conductive films (ACF), solder layers and the like. ACF is an abbreviation for anisotropic conductive film. An example of the electronic devices is a preamplifier. In this specification, the terminals for flexible circuit boards may as well be referred to as board terminals.

When connecting a tail terminal and a board terminal to each other by an ACF, the ACF is placed between the tail terminal and the board terminal. While maintaining this condition, the ACF is pressurized and heated. As a result, the tail terminal and the board terminal are electrically connected to each other with the ACF interposed therebetween, and both are fixed to each other. When connecting using a solder layer, heating is carried out with some pressurization.

In order to increase the amount of data to be recorded on a disk drive, there a trend to increase the number of disks built in the disk drive. In line with this trend, the number of suspensions used in the disk drive is accordingly increasing. Moreover, as the suspensions become more multifunctional, the number of conductor's in the wiring portion of the flexure is increasing. As a result, the number of tail terminals to be placed in the tail pad portion is increasing. However, since the space inside the disk drive is limited, as the number of tail terminals increases, the size of the tail terminals must be reduced. Moreover, a large number of tail terminals must be densely arranged in the tail pad portion.

The tail terminals are formed to be integrated with the respective conductors at the end of each conductor. The height of the tail terminals in the thickness direction is the same as the height of the conductors in the thickness direction. Since the tail terminals are not covered by the cover layer, the surfaces of the tail terminals are exposed. In contrast, the conductors are covered by the cover layer. Due to this configuration, when a conductive material for connection such as ACF is interposed between a tail terminal and a beard terminal and pressurized, the pressurization may vary or may be insufficient. Insufficient pressurization may cause a connection error between the tail terminal and the board terminal.

In the terminal connection portion described in Patent Literature 1, ACF is placed between the tail terminal and the board terminal, and pressurization and heating are carried out by a jig. However, since the thickness of the tail terminal is the same as that of the conductor and the conductor is covered by a cover layer, the pressing force may vary or be insufficient when the ACF is pressed by the jig.

In the terminal connection portion described in Patent Literature 2, a part of the base insulating layer (where the tail terminal is disposed) includes a terminal support portion formed therein, which is relatively thicker than the other parts. Note here that, in order to form portions of thickness differing from each other (thicker and thinner portions) on a part of the base insulation layer, an exceptional manufacturing process is required.

An object of embodiments of the present invention is to provide a terminal connection portion that can securely connect a tail terminal (first terminal) of a flexure of, for example, a disk drive suspension and a board terminal (second terminal) to each other by means of a connecting conductive member such as ACF.

BRIEF SUMMARY OF THE INVENTION

According to an embodiment, a terminal connection portion includes a first terminal of a wiring portion and a second terminal disposed on an opposite side to the first terminal. The wiring portion includes a base insulating layer, a conductor formed on the base insulating layer, a cover layer which covers the conductor, and the first terminal formed at an end of the conductor. The first terminal is integrated with the conductor as one body. The first terminal and the second terminal are each mainly made of copper and gold plating or the like is applied on the surface as necessary.

The first terminal includes a base portion, a bent portion and an overlapping portion. The base portion includes a first surface and a second surface on an opposite side to the first surface. The first surface is situated along the base insulating layer and fixed to the base insulating layer. The bent portion is reversed in a thickness direction of the base portion from the end of the base portion towards the second, surface. The overlapping portion extends from the bent portion in a direction along the second surface. A connecting conductive member is disposed between the overlapping portion and the second terminal. The connecting conductive member fixes and electrically connects the overlapping portion and the second terminal to each other. An example of the connecting conductive member is an anisotropic conductive film (ACF). The connecting conductive member may be a solder layer.

According to one of the embodiments of the present invention, a tail terminal (first terminal) located at a tail pad portion of a flexure, for example, and a terminal (second terminal) of a circuit board can be connected reliably by a connecting conductive member such as ACF.

The first terminal is a tail terminal provided at the tail pad portion of the flexure, for example. The second terminal is a board terminal provided on the circuit board, for example. The tail pad portion may have an opening and a plurality of first terminals may be disposed on an edge portion of an inner side of the opening. The first terminal and a third terminal may be disposed in the tail pad portion. The height of the third terminal along the thickness direction is less than the height of the first terminal along the thickness direction.

Between the second surface of the first terminal and the overlapping portion, there may be a resin spacer portion, which is a part of the novel layer. The first terminal may include an extension portion. The extension portion extends from the overlapping portion in a direction of the cover layer and overlaps the cover layer. Between the extension portion inside the cover layer and the base insulation layer, a conductor electrically insulated from the first terminal may be disposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

A terminal connection portion of a tail pad portion according to the first embodiment will, now be described with reference to FIGS. 1 to 7.

Figure 1:
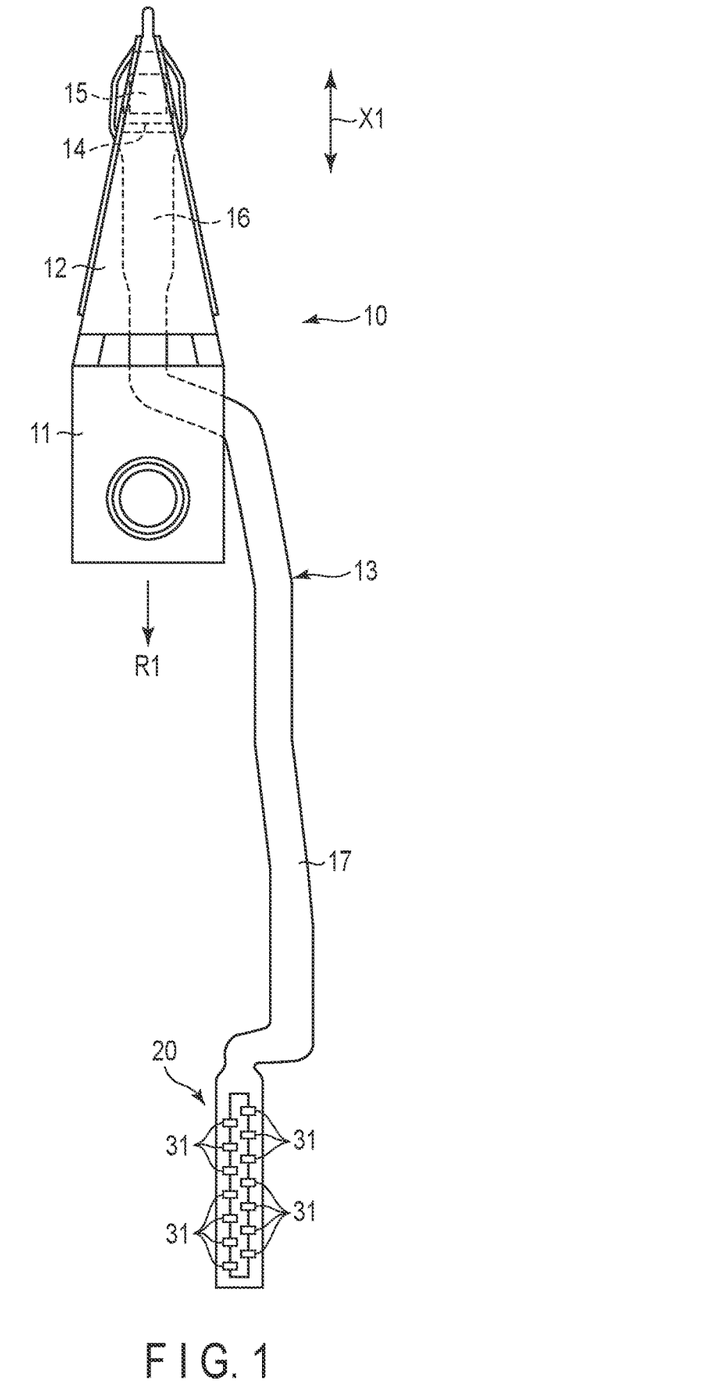
FIG. 1 is a plan view of a suspension including a tail pad portion according to the first embodiment.

FIG. 1 is a plan view showing an example of a suspension 10 to be used in a hard disk drive. The suspension 10 comprises a base plate 11, a load beam 12, a flexure 13, a slider 15 and the like. The slider 15 is provided on a tongue portion 14 of the flexure 13.

The flexure 13 includes a flexure main body 16 and a flexure tail 17. The flexure main body 16 is fixed to the load beam 12. The flexure tail 17 extends from the flexure main body 16 to a rear side of the base plate 11 (in the direction indicated by R1 in FIG. 1). At an end portion of the flexure tail 17, a tail pad portion 20 is formed.

The load beam 12 is made from a stainless steel plate and extends in a length direction of the suspension 10. The direction indicated by the bidirectional arrow X1 in FIG. 1 is a longitudinal direction of the load beam 12, that is, the longitudinal direction of the suspension 10. The thickness of the load beam 12 is, for example, 20 to 40 μm, but may be of some other thickness.

Figure 2:
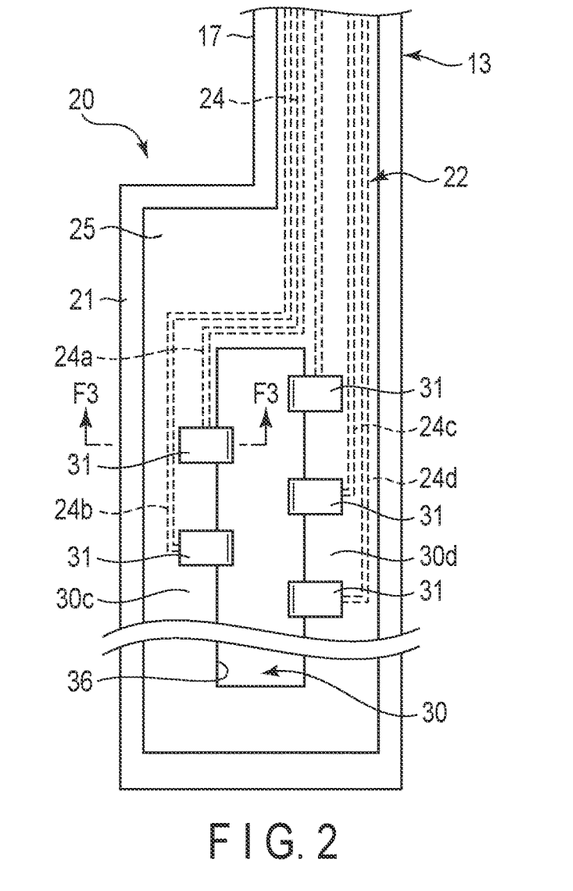
FIG. 2 is a plan view schematically showing a part of the tail pad portion of the suspension shown in FIG. 1.
Figure 3:
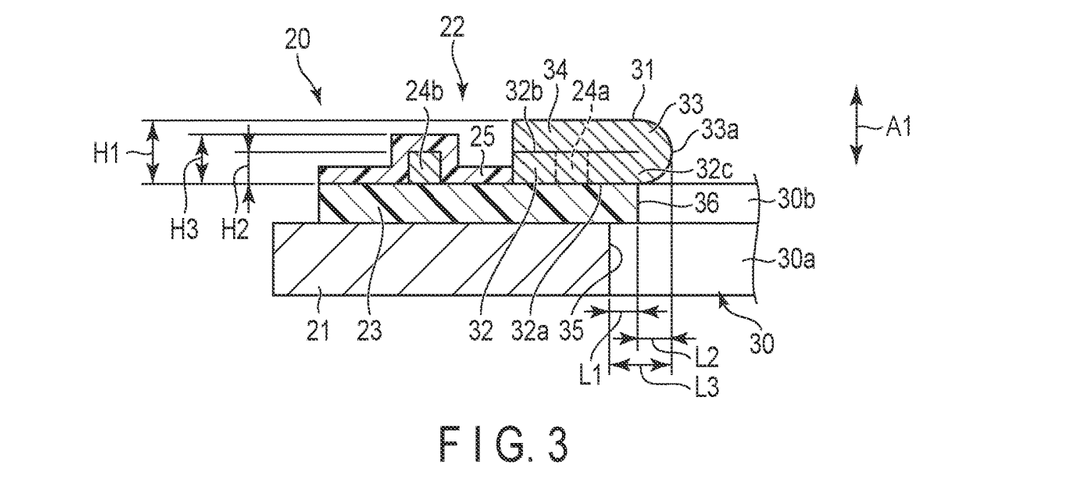
FIG. 3 is a cross-sectional view of the tail pad portion taken along line F3-F3 in FIG. 2.

FIG. 2 is a plan view schematically showing a part of the tail pad portion 20. FIG. 3 is a cross-sectional view of the tail pad portion 20 taken along line F3-F3 in FIG. 2. The tail pad portion 20 includes a metal base (metal substrate) 21 and a wiring portion 22. The metal base 21 is made from a thin plate of stainless steel. The wiring portion 22 is disposed along the metal base 21. In example of the thickness of the metal base 21 is 20 μm to 25 μm), which is less than the thickness of the load beam 12.

As shown in FIGS. 2 and 3, the wiring portion 22 includes a base insulating layer 23, a conductor group 24 and a cover layer 25. The base insulating layer 23 is made from an electrically insulating resin such as polyimide. The conductor group 24 includes a plurality of conductors 24a, 24b, 24c and 24d (only some are shown). The conductors 24a, 24b, 24c and 24d are formed on the base insulation layer 23. The cover layer 25 is made from an electrically insulating resin such as polyimide and covers the conductor group 24.

In the tail pad portion 20, arm opening 30 is formed. As shown in FIG. 3, the opening 30 includes a first opening 30a formed in the metal base 21 and a second opening 30b formed in the base insulating layer 23. The openings 30a and 30b are opened in the thickness direction of the tail pad portion 20.

In the opening 30, inner edge portions 30c and 30d oppose each other. On the inner edge portions 30c and 30d, a plurality of first terminals (tail terminals) 31 are disposed. The first terminals 31 are formed to be integrated with the respective conductors at the end of each conductor by copper (for example, plated copper) common to that of the conductors. The conductors 24a to 24d are each covered by the cover layer 25. On the other hand, the first terminals 31 are not covered by the cover layer 25. Therefore, the surfaces of the first terminals 31 are exposed.

As shown in FIG. 3, the first terminals 31 each include a base portion 32, a bent portion 33 and an overlapping portion 34. The base portion 32 is fixed to the base insulation layer 23 along the base insulation layer 23 itself. The base portion 32 includes a first surface 32a situated along the base insulating layer 23 and a second surface 32b on an opposite side to the first surface 32a. The direction indicated by the bidirectional arrow A1 shown in FIG. 3 is the thickness direction of the first terminal 31.

The bent portion 33 has such a shape that its direction reverses 180° in the thickness direction from the end 32c of the base portion 32 towards the second surface 32b. That is, the bent portion 33 has a U shape along a lateral direction in FIG. 3. As shown in FIG. 3, a side surface 36 of the base insulating layer 23 protrudes by a length L1 with respect to the side surface 35 on an inner side of the opening 30 of the metal base 21. Further, an end surface 33a of the bent portion 33 protrudes by a length L2 with respect to the side surface 36 of the base insulating layer 23. Between the side surface 35 of the metal base 21 and the end surface 33a of the first terminal 31, an insulating distance L3 (L1+L2) is defined so as to enhance electrics insulation.

The overlapping portion 34 extends from the bent portion 33 in a direction along the second surface 32b. Further, the overlapping portion 34 overlaps the second surface 32b of the base portion 32. With this structure, a height H1 of the first terminal 31 along the thickness direction (shown in FIG. 3) is substantially twice a height H2 of the conductor 24a.

Figure 4:
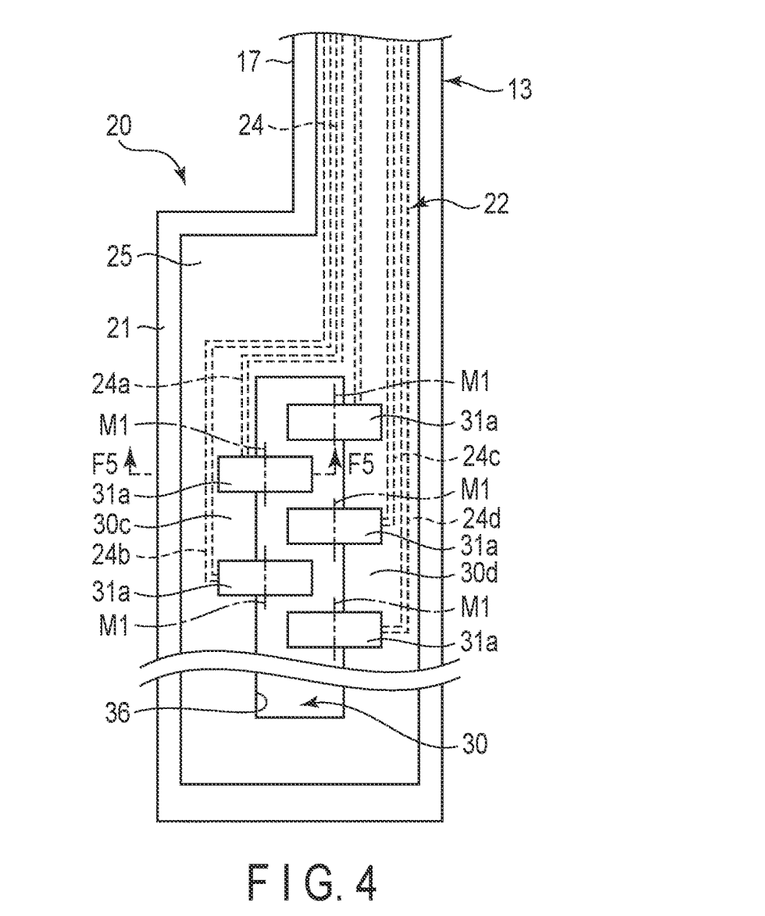
FIG. 4 is a plan view schematically showing the state of the tail pad portion shown in FIG. 2 before bending a first terminal.
Figure 5:
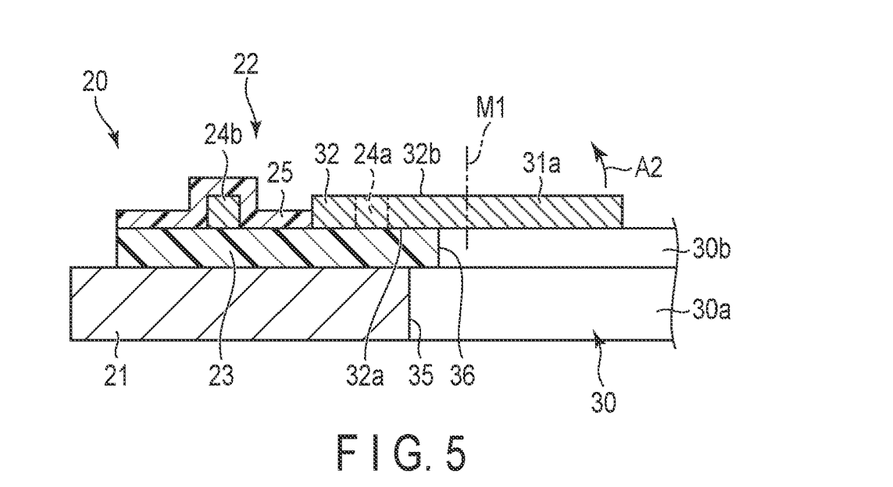
FIG. 5 is a cross-sectional view of the tail pad portion taken alone line F5-F5 in FIG. 4.

FIG. 4 is a plane view of the tail pad portion 20 with a terminal member 31a before forming the bent portion 33 and the overlapping portion 34. FIG. 5 is a cross-sectional view of the tail pad portion 20 taken along line F5-F5 in FIG. 4. As shown in FIGS. 4 and 5, on the edge portions 30c and 30d of the opening 30 of the tail pad portion 20, a flat-plate terminal member 31a is formed. The terminal member 31a is formed by a manufacturing process such as plating or etching.

The terminal member 31a is bent at a longitudinal middle portion M1 (indicated by one dot chain line in FIG. 4) along the thickness direction of the terminal member 31a (indicated by arrow A2 in FIG. 5). Thus, the first terminal S1 including the bent portion 33 and the overlapping portion. 34 shown in FIGS. 2 and 3 is formed.

Figure 6:
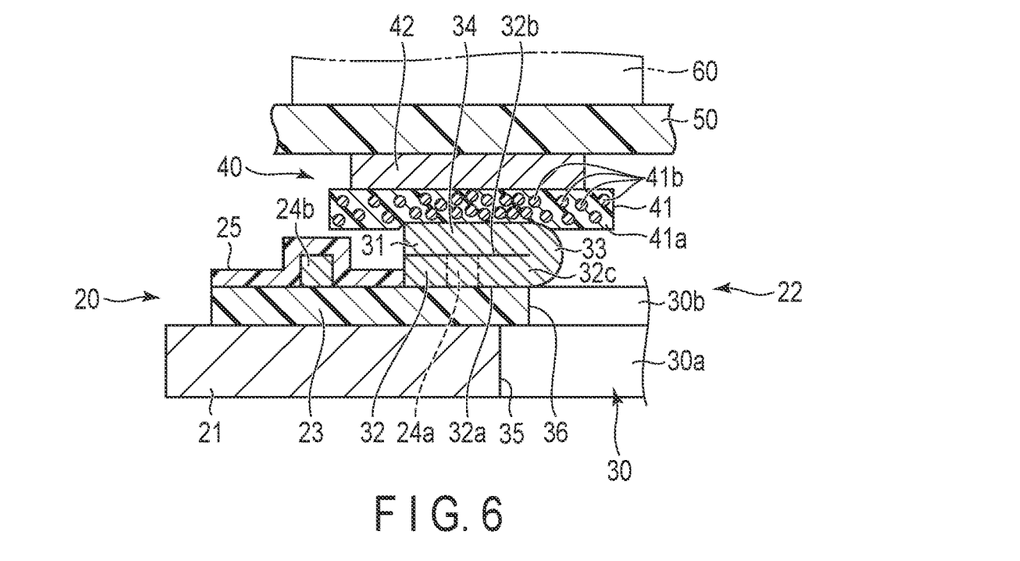
FIG. 6 is across-sectional view schematically showing the state in which the first terminal shown in FIG. 3 is connected to s second terminal by ACF.

FIG. 6 is a cross-sectional view of a terminal connection portion 40 including a first terminal 31. The terminal connection portion 40 includes first terminals 31, an anisotropic conductive film (ACF) 41 as a connecting conductive member, and second terminals 42 for parts to be connected. The first terminals 31 and the second terminals 42 are connected to each other by the ACF 41. The first terminals 31 and the second terminals 42 are each mainly made of copper, with a coating film such as a gold plating or the like applied to the surface as necessary.

Figure 7:
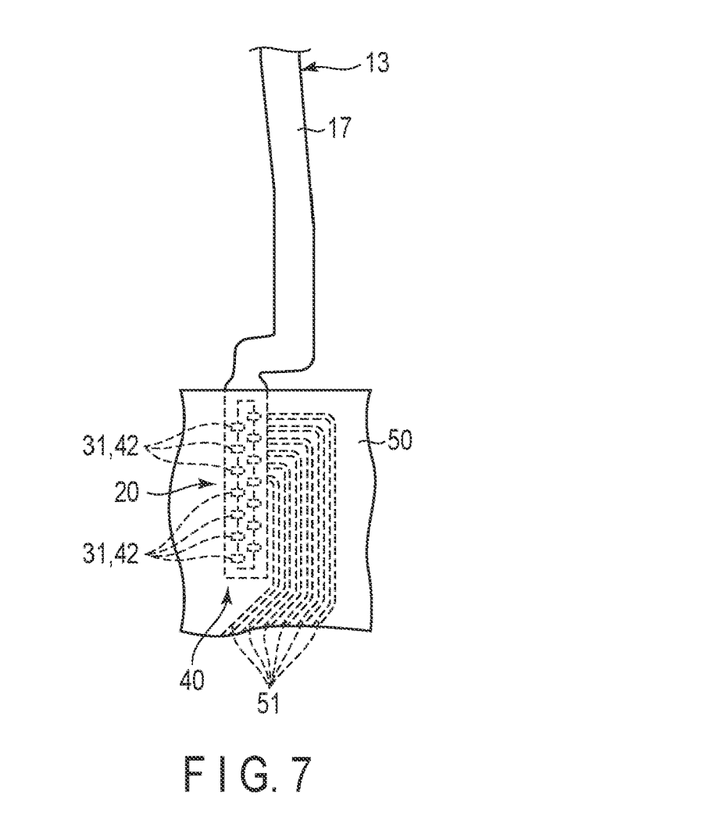
FIG. 7 is a plan view showing the tail pad portion of the suspension shown in FIG. 1 and a circuit board.

FIG. 7 shows the tail pad portion 20 and a part of a circuit board 50 in this embodiment. On the circuit board 50, the second terminals 42 are disposed at positions corresponding to the first terminals 31, respectively. On the circuit board 50, electronic parts including a preamplifier or the like for signal processing are mounted. Conductors 51 provided on the circuit board 50 electrically continue with the second terminals 42, respectively.

As shown in FIG. 6, between the first terminal 31 and the second terminal 42, the ACF 41 is disposed. The ACF 41 contains a thermosetting base resin 41a and a number of conductive particles 41b mixed into the base resin 41a. The particle diameter of the conductive particles 41b is very for example, ranging from several micrometers (μm) to several tens of micrometers (μm) In FIG. 6, however, the conductive particles 41b are illustrated to be large for convenience of explanation.

The ACF 41 disposed between the first terminal 31 and the second terminal 42 is pressurized and heated by a jig 60. As a result, the conductive particles 41b located between the first terminal 31 and the second terminal 42 undergo dielectric breakdown, thereby achieving electrical conduction between the first terminal 31 and the second terminal 42. Then, as the temperature lowers, the base resin 41a hardens. Thus, the first terminal 31 and the second terminal 12 are electrically continued with each other and also mechanically fixed to each other via the ACF 41.

The first terminal 31 of this embodiment includes an overlapping portion 34 which overlaps the base portion 32. As shown in FIG. 3, the height H1 of the first terminal 31 along the thickness direction is greater than a height H3 of the cover layer 25 which covers the conductors 24a and 24b. As shown in FIG. 6, between the first terminal 31 and the second terminal 42, the ACF 41 is disposed. The ACF 41 is pressurized between the first terminal 31 and the second terminal 42. During the pressurization, the conductors 24a and 21b and the cover layer 25 do not interfere with the pressurization of the ACF 41, and the ACF 41 can be pressurized and heated reliably. Therefore, it is possible to securely connect the first terminal 31 and the second terminal 42 to each other by the ACF 41.

Figure 8:
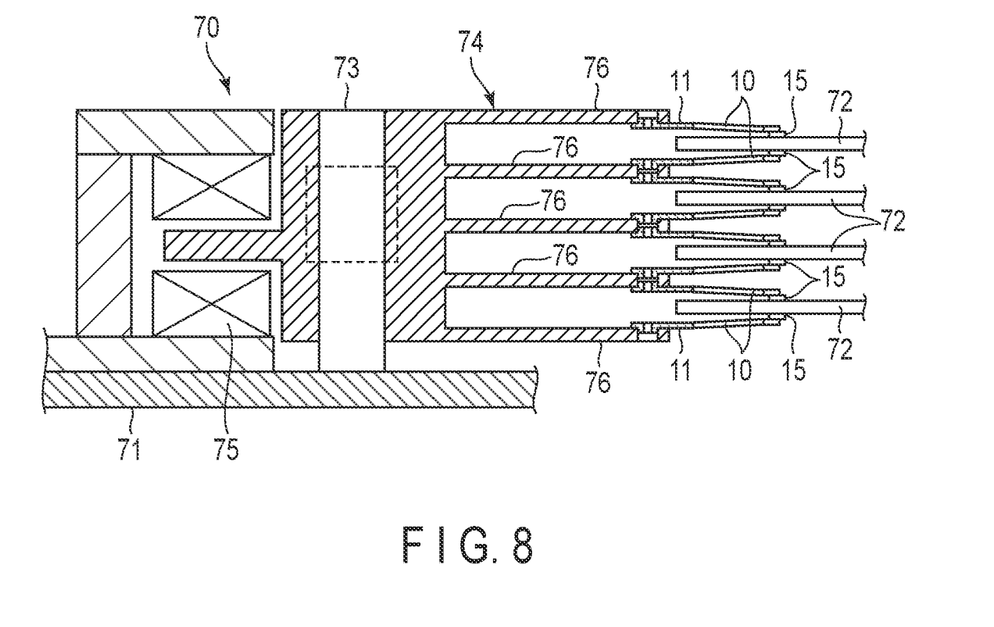
FIG. 8 is a cross-sectional view schematically showing an example of a disk drive.

FIG. 8 is a cross-sectional view schematically showing an example of a disk drive 70. The disk drive 70 includes a case 71 (only a part is shown), disks 72, a carriage 74 and a motor 75 for positioning. The disks 72 rotate around a spindle. The carriage 74 pivots around a pivot axis 73. The motor 75 drives the carriage 74. The case 71 is sealed by a lid. A suspension 10 is attached to a distal end of each of multiple arm portions 76 or the carriage 74.

When the disks 72 are rotated at high speed, an air bearing is formed between the slider 15 and each disk 72. When the carriage 74 is pivoted by the motor 75 for positioning, the suspension 10 moves in the radial direction of the disk 72. With this operation, the slider 15 is moved to a desired position on the disk 72.

Second Embodiment

Figure 9:
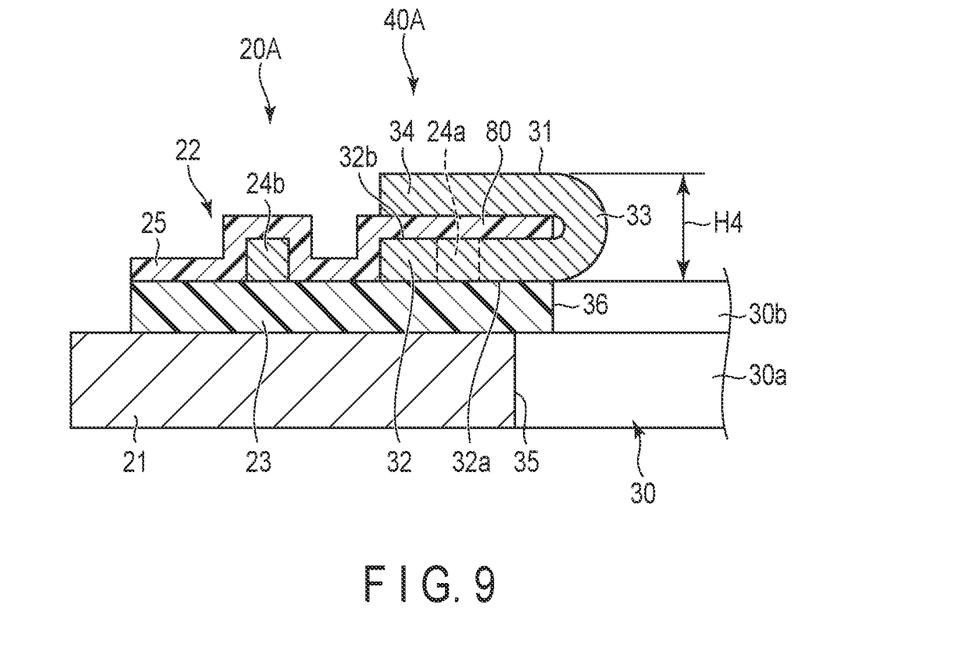
FIG. 9 is a cross-sectional view showing a part of a tail pad portion according to the second embodiment.

FIG. 9 is a cross-sectional view showing a part of the tail pad portion 20A with a terminal connection portion 401, according to the second embodiment. Between the base portion of the first terminal 31 of the tail pad portion 201 and the overlapping portion 34, a resin spacer portion 80 is disposed. The resin spacer portion 60 is a part of the cover layer 25 and, as in the case of the cover layer 25, is made of an electrically insulating resin such as polyimide.

As shown in FIG. 9, the terminal connection portion 40A of this embodiment includes the resin spacer portion 80. The resin spacer portion 80 is provided between the base portion 32 of the first terminal 31 the overlapping portion 34. Therefore, a height H4 of the first terminal 31 from the base insulating layer 23 can be made greater than the height H1 of she first terminal 31 of the first embodiment (shown in FIG. 3). With regard to the other configuration and operations, the tail pad portion 201 of the second embodiment is similar to the tail pad portion % of the first embodiment (FIGS. 1 to 7), and therefore, common structural elements are denoted by common symbols, and the explanations thereof will be omitted.

Third Embodiment

Figure 10:
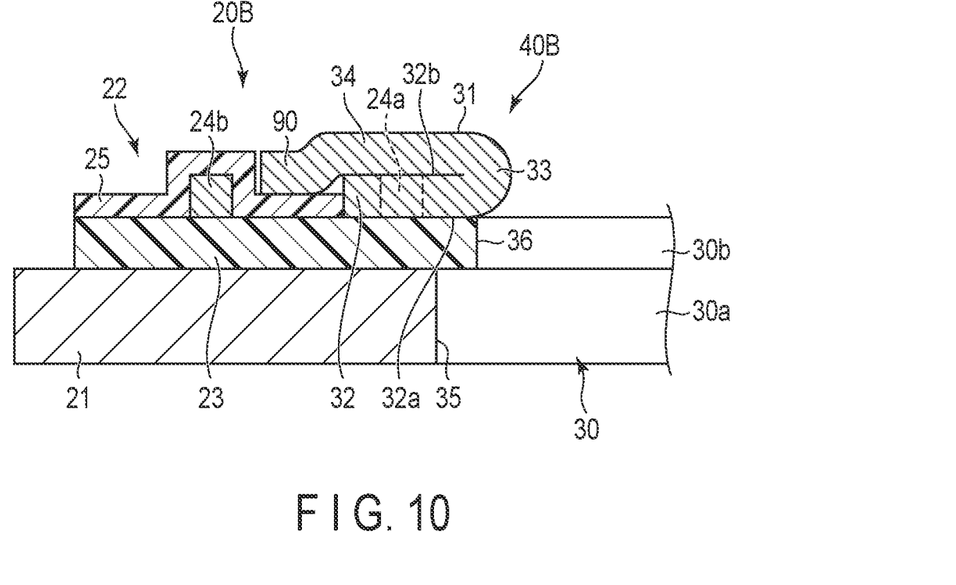
FIG. 10 is a cross-sectional view showing a part of a tail pad portion according to the third embodiment.

FIG. 10 shows a tail pad portion 20B with a terminal connection portion 40B according to the third embodiment. A first terminal 31 of the tail pad portion 20B includes a base portion 32, a bent portion 33, an overlapping portion 34 and an extension portion 90. The base portion 32 is fixed to a base insulation layer 23. The extension portion 90 extends from the overlapping portion 34 in a direction of the cover layer 25 and overlaps the cover layer 25. With regard to the other configuration and operations, the tail pad portion 20B of the third embodiment is similar to the tail pad portion 20 of the first embodiment (FIGS. 1 to 7), and therefore, common structural elements are denoted by common symbols, and the explanations thereof will be omitted.

Fourth Embodiment

Figure 11:
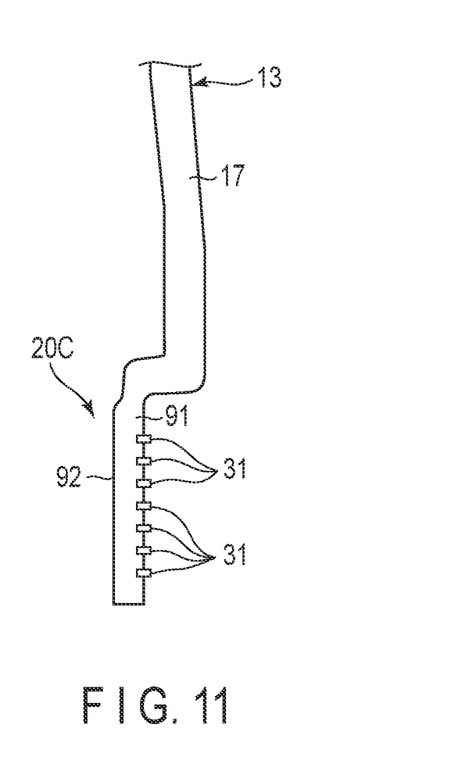
FIG. 11 is a plan view showing a part of a flexure tail including a tail pad portion according to the fourth embodiment.

FIG. 11 shows a part of a flexure tail 17 with a tail pad portion 20C according to the fourth embodiment. A plurality of first terminals 31 provided in the tail pad portion 20C are disposed along a side 91 of the tail pad portion 200 on one side. The first terminals 31 may be disposed on another side 92 of the tail pad portion 20C on the other side. With regard to the other configuration end operations, the tail pad portion 200 of the fourth embodiment is similar to the tail pad portion 20 of the first embodiment (FIGS. 1 to 7), and therefore, common structural elements are denoted by common symbols, and the explanations thereof will be omitted.

Fifth Embodiment

Figure 12:
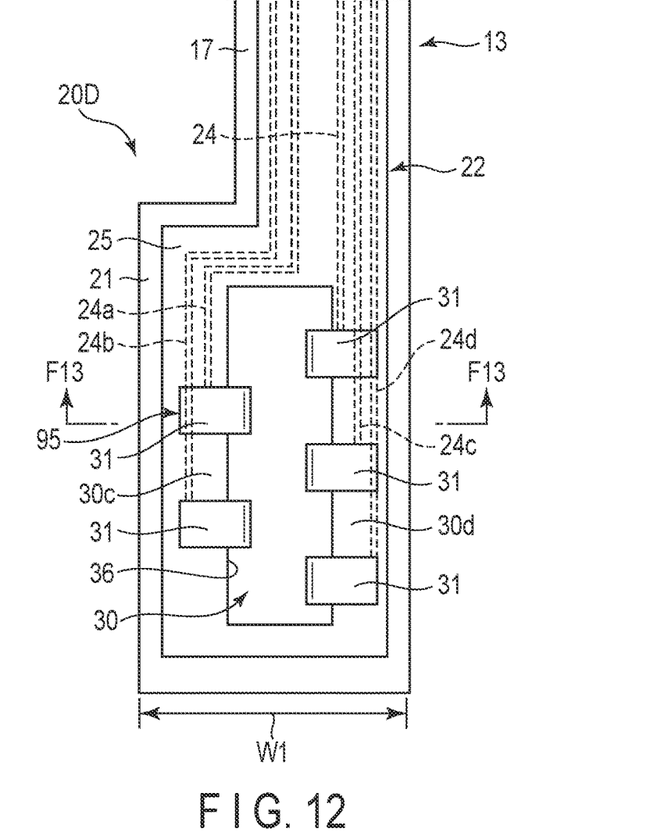
FIG. 12 is a plan view showing a tail pad portion according to the fifth embodiment.
Figure 13:
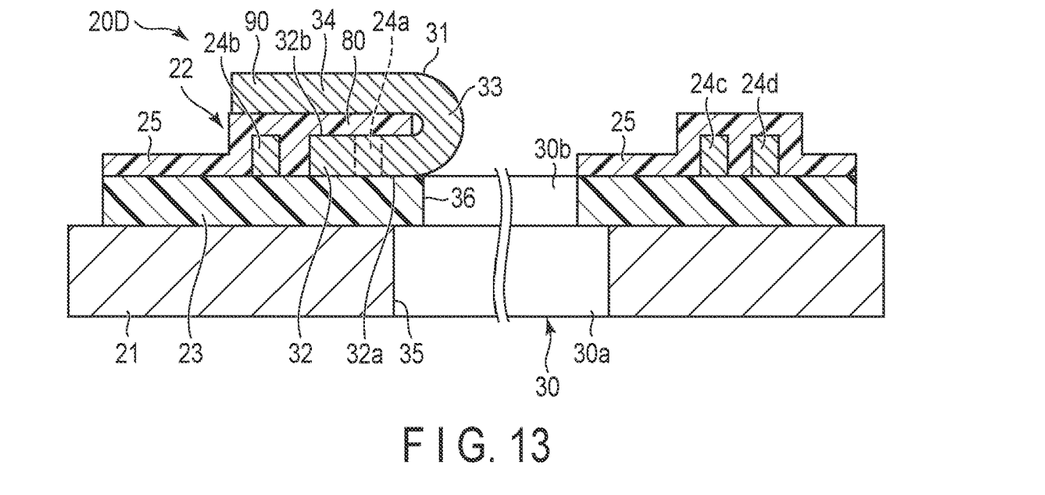
FIG. 13 is a cross-sectional view of the tail pad portion taken along line F13-F13 in FIG. 12.

FIG. 12 is a plan view showing a tail pad portion 200 according to the fifth embodiment. FIG. 13 is a cross-sectional view of the tail pad portion 20D taken along line F13-F13 in FIG. 12. The tail pad portion 200 includes a conductor 24b disposed inside the cover layer 25. The conductor 240 is located inside the cover layer 25, between an extending portion 90 of the first terminal 31 and the base insulating layer 23. Thus, the conductor 24b is electrically insulated from the first terminal 31.

In the plan view of the tail pad portion 20D shown in FIG. 12, there is a site 95 where the first terminal 31 and the conductor 24b intersect each other. Even if the intersection site 95 exists, it is possible to avoid the first terminal 31 and the conductor 24b from electrically short-circuiting. According to the tail pad portion 22D having such a configuration as described above, a width W1 of the tail pad portion 201D can be reduced compared to the case where the conductor 24b is bypassed around an outer side of the first terminal 31. Therefore, in the case of a disk drive with a large number of disks, it is easier to secure a space for arranging a large number of tail pad portions 22D side by side, which is advantageous.

Sixth Embodiment

Figure 14:
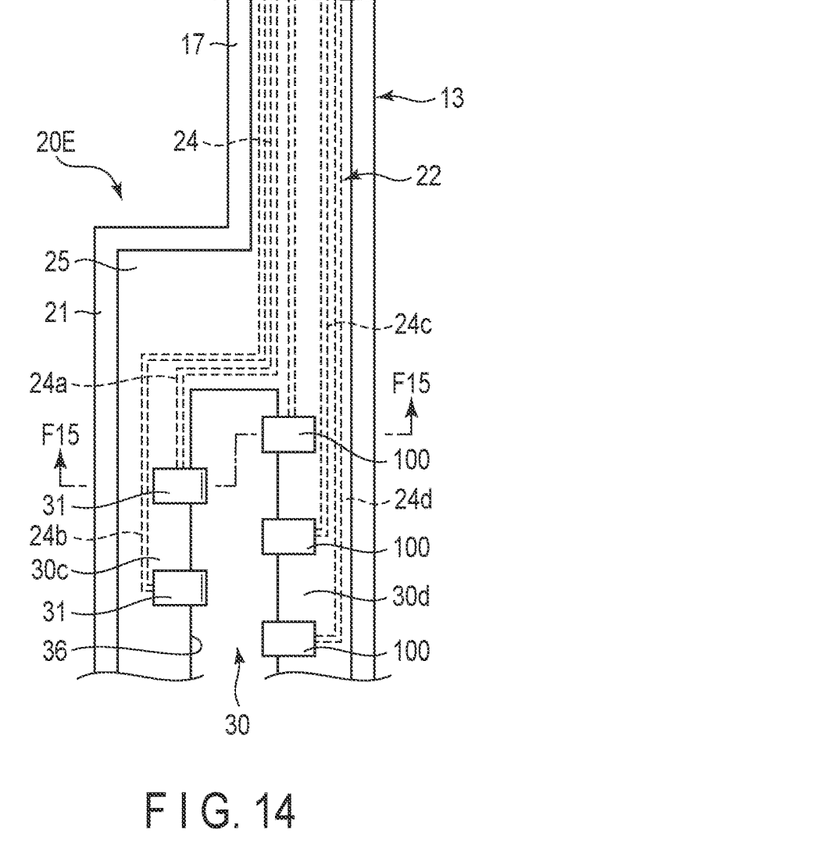
FIG. 14 is a plan view showing a part of a tail pad portion according to the sixth embodiment.
Figure 15:
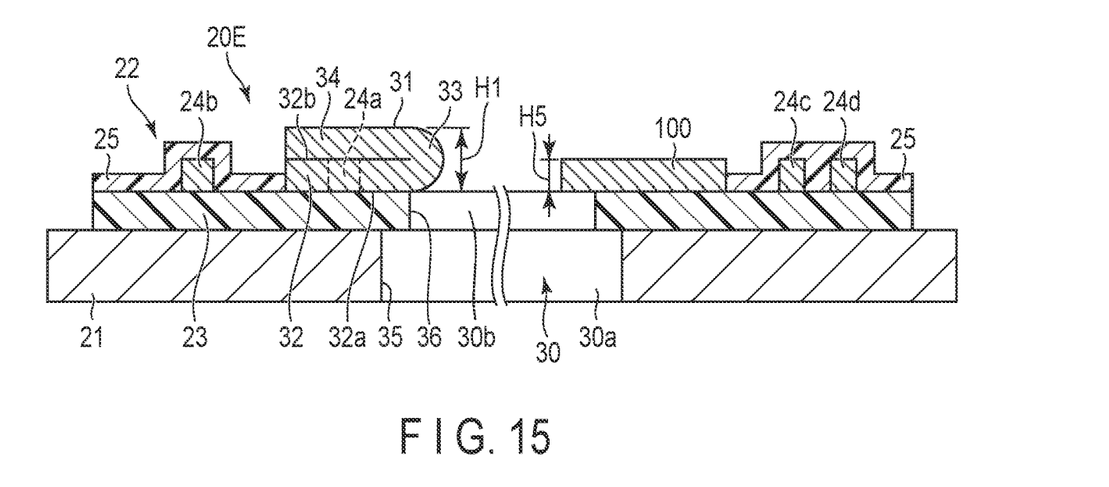
FIG. 15 is a cross-sectional view of the tail pad portion taken along line F15-F15 in FIG. 14.

FIG. 14 shows a tail pad portion 20E according to the sixth embodiment. FIG. 15 is a cross-sectional view of the tail pad portion 20E taken along line F15-F15 in FIG. 14. The tail pad portion 20E includes a first terminal 31 including an overlapping portion 34 and a flat third terminal 100 which does not include an overlapping portion 34. A height H5 of the third terminal 100 (shown in FIG. 15) is less (lower) than the height H1 of the first terminal 31. With the arrangement that the first terminal 31 and the third terminal 100, whose heights are different from each other, are located on the tail pad portion 20E, making it possible to accommodate multiple second terminals of two different heights. The first terminal 31 and the third terminal 100 each mays be mainly made of copper, with a gold plating or the like applied to the surface as necessary.

Needless to say, in carrying out the present invention, the specific modes of the suspension, circuit board, etc., which are examples of the electronic devices, as well as the shape and position of the first and second terminals can be changed in various ways. Further, the technical concept of the present invention may as well be applied to terminal connection portions of electronic devices other than the disk drives.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A terminal connection portion for an electronic device including a first terminal of a wiring portion and a second terminal disposed to oppose the first terminal,
   the wiring portion including:
   a base insulating layer;
   conductors formed on the base insulation layer;
   a cover layer which covers the conductors; and
   the first terminal formed at an end of each of the conductors and integral with each of the conductors, and
   the first terminal comprising:
   a base portion including a first surface fixed to the base insulation layer along the base insulation layer and a second surface on an opposite side to the first face;
   a bent portion reversed in a thickness direction of the base portion from an end of the base ort ion towards the second surface;
   an overlapping portion extending from the bent portion in a direction along the second surface; and
   a connecting conductive member disposed between the overlapping portion and the second terminal to fix and electrically connect the overlapping portion and the second terminal to each other.

2. The terminal connection portion according to claim 1, wherein
   the connecting conductive member is an anisotropic conductive film.

3. The terminal connection portion according to claim 1, wherein the first terminal is a tail terminal provided on each of tail pad portions of a flexure of a suspension for a disk drive, and the second terminal is a board terminal provided on a circuit board.

4. The terminal connection portion according to claim 3, wherein the tail pad portion each comprise an opening, and a plurality of the first terminals are disposed on an edge portion of an inner side of the opening.

5. The terminal connection portion according to claim 3, wherein the first terminal and a third terminal having a height in the thickness direction less than that of the first terminal are disposed on the tail pad portion.

6. The terminal connection portion according to claim 1, further comprising a resin spacer portion, which is a part of the cover layer, between the second surface of the first terminal and the overlapping portion.

7. The terminal connection portion according to claim 1, wherein the first terminal includes an extension portion extending from the overlapping portion in a direction of the cover layer to overlap the cover layer.

8. The terminal connection portion according to claim 1, wherein the first terminal includes an extension portion extending, from the overlapping portion in a direction of the cover layer to overlap the cover layer, and a conductor electrically insulated from the first terminal is disposed between the extension inside the cover layer and the base insulation layer.

* * * * *